(12) United States Patent
Sekiguchi et al.

(10) Patent No.: US 8,674,215 B2
(45) Date of Patent: Mar. 18, 2014

(54) PHOTOELECTRIC DEVICE

(75) Inventors: Takashi Sekiguchi, Suita (JP); Shingo Kambe, Hirakata (JP); Satoko Kambe, legal representative, Shinjuku-ki (JP); Hiroyuki Nishide, Shinjuku-ku (JP); Kenichi Oyaizu, Shinjuku-ku (JP); Fumiaki Kato, Shinjuku-ku (JP); Akira Takahashi, Shinjuku-ku (JP); Takeyuki Yamaki, Ikoma-gun (JP); Mitsuo Yaguchi, Ibaraki (JP); Michio Suzuka, Shijonawate (JP)

(73) Assignees: Panasonic Corporation, Kadoma-shi (JP); Waseda University, Tokyo (JP)

( * ) Notice: Subject to any disclaimer, the term of this patent is extended or adjusted under 35 U.S.C. 154(b) by 319 days.

(21) Appl. No.: 12/737,865

(22) PCT Filed: Jul. 31, 2009

(86) PCT No.: PCT/JP2009/063653
§ 371 (c)(1),
(2), (4) Date: Feb. 24, 2011

(87) PCT Pub. No.: WO2010/024090
PCT Pub. Date: Mar. 4, 2010

(65) Prior Publication Data
US 2011/0146796 A1  Jun. 23, 2011

(30) Foreign Application Priority Data
Aug. 28, 2008 (JP) ................................. 2008-220367

(51) Int. Cl.
*H01L 31/00* (2006.01)
(52) U.S. Cl.
USPC .......................................... 136/263; 136/252

(58) Field of Classification Search
CPC . H01G 9/2009; H01G 9/2018; H01G 9/2059; H01L 51/005; H01L 51/424
USPC ................................................... 136/263, 252
See application file for complete search history.

(56) References Cited

U.S. PATENT DOCUMENTS

| 2003/0062080 | A1 | 4/2003 | Satoh et al. |
| 2005/0263183 | A1* | 12/2005 | Nishikitani et al. .......... 136/263 |

(Continued)

FOREIGN PATENT DOCUMENTS

| JP | 2003100360 A | 4/2003 |
| JP | 2004-288985 A | 10/2004 |
| JP | 2006-172758 A | 6/2006 |

OTHER PUBLICATIONS

Zhang, et al. "2,2,6,6-tetramethy 1-1-piperidinyloxy radical: an efficient, iodine-free redox mediator for dye-sensitized solar cells," Advanced Functional Materials. 2008, 18.341-346.

(Continued)

*Primary Examiner* — Eli Mekhlin
(74) *Attorney, Agent, or Firm* — Edwards Wildman Palmer LLP; James E. Armstrong, IV

(57) ABSTRACT

This invention aims to provide a photpelectrical device with a superior conversion efficiency, which comprises an electron transport layer giving a superior electron-transporting performance and a sufficiently large dimentional interface. The photoelectric device further comprises a pair of electrode and a hole transport layer with the electron transport layer and the hole transport layer being interposed between electrodes. The electron transport layer is made of an organic compound having a redox moiety capable of being oxidized and reduced repeatedly. The organic compound is included in a gel layer containing an electrolyte solution which stabilizes a reduction state of the redox moiety.

15 Claims, 2 Drawing Sheets

(56) References Cited

U.S. PATENT DOCUMENTS

2007/0042281 A1* 2/2007 Orito et al. .................. 430/59.5
2008/0041438 A1 2/2008 Saito et al.

OTHER PUBLICATIONS

Supplementary European Search Report for European Application No. 09809744.7 issued Nov. 10, 2011.
International Search Report for PCT/JP2009/063653 dated Feb. 11, 2009.
Peumans, P., Applied. Physics Letters, "Very-high-efficiency double-heterostructure copper phthalocyanine/$C_{60}$ Photovoltaic cells" vol. 79, pp. 126, 2001.
Tang, C. W., Applied. Physics Letters, "Two-layer organic plastic solar cells" vol. 78, pp. 841, 2001.
Shaheen, Sean E., Applied. Physics Letters, "2.5% efficient organic photovoltaic diodes based on doped pentacene" Vo. 403, pp. 408, 2000.
Schön, J. H., Nature (London), "Efficient organic photovoltaic diodes based on doped pentacene" vol. 403, pp. 408, 2000.
Imahori, et al., "Prospect of Molecular Solar Cells," Jul. 2001, pp. 41 with English Abstract thereof.
Office Action dated Dec. 12, 2012, issued for the Chinese patent application No. 200980133884.5 and English abstract thereof.
Tang, C. W., Appl. Phys. Lett., "Two-layer organic photovoltaic cell" vol. 48, pp. 183, 1986.
Shaheen, Sean E., Appl. Phys. Lett., "2.5% efficient organic plastic solar cells," vol. 78, pp. 841, (2001).

* cited by examiner

PHOTOELECTRIC DEVICE

TECHNICAL FIELD

This invention relates to photoelectric devices either for conversion of light into electricity or for conversion of electricity into light.

BACKGROUND ART

Recently, photoelectric devices have been utilized for production of electricity-generating devices (e.g., photobatteries and solar cells) performing photoconversion, and luminescence devices (e.g., organic ELs), photo display devices (e.g., electrochromic display devices and electronic papers) and thermo/photo-sensitized devices.

The electron transport layer utilized in each of these photoelectric devices is required to provide high electron-transporting performances, and generate electrons in response to energies supplied from outside. As well, the electron transport layer needs to have an interface dimension large enough to act in response to electron injected from outside. Conventionally, such electron transport layers are formed of metals, organic semiconductors, inorganic semiconductors, electrically conductive polymers, electrically conductive carbons, or the like.

For instance, in the photoelectric conversion device, the electron transport layer has been formed of electron-capturing organic substances, such as fullerene (cf. non-patent reference 1), peryrene rerivatives (cf. non-patent reference 2), polyphenylenevinylene derivatives (cf. non-patent reference 3), pentacene (cf. non-patent reference 4). With use of the above-listed compound, the photoelectric conversion device has been improved in terms of its conversion efficiency owing to improved electron transporting performance.

Non-patent reference 5 discloses a molecular device solar cell having a substrate formed with a film made of a compound containing an electron donor molecule (donor) and an electron acceptor molecule (acceptor) which are chemically linked to each other.

REFERENCES

Non-Patent References

Non-patent reference 1: P. Peumans, Appl. Phys. Lett., vol. 79, pp. 126, 2001.
Non-patent reference 2: C. W. Tang, Appl. Phys. Lett., vol. 48, pp. 183, 1986.
Non-patent reference 3: S. E. Shaheen, Appl. Phys. Lett, vol. 78, pp. 841, 2001.
Non-patent reference 4: J. H. Schon, Nature (London), vol. 403, pp. 408, 2000.
Non-patent reference 5: Kagaku-kogyo "prospect of molecular solar cells", July, 2001, pp. 41, Hiroshi Imahori and Syunichi Fukuzumi.

SUMMARY OF THE INVENTION

Technical Problem

However, the electron transport layers reported in the above non-patent references insufficiently give sufficient electron-transporting performances, and inadequately have interface dimensions for transporting electrons. At present, such electron transport layers are required to have superior electron-transporting performances as well as sufficient interface dimensions for transporting electrons.

For example, in organic electron transport layers made of fullerene or the like, electrons and charges are easily recombined to each other. It leads to decrease of an effective diffusion distance, making it difficult to further improve its conversion efficiency. The effective diffusion distance refers to a distance required for separated charges to migrate to an electrode. When being made of inorganic substances such as titan oxide, electron transport layer insufficiently has an interface dimension required for charge separation. Besides, in the electron transport layer, en electron conduction potetential primarily depends on constituents, leading to indufficient conversion efficiency.

The present invention has been accomplished in view of the above problems, and is intended to provide a photoelectric device exhibiting superior electron transporting performance and superior conversion efficiency with an electron transport layer having a sufficiently large interface dimention.

Solution to Problem

A photoelectrical device in accordance with claim 1 of the present invention comprises a pair of electrodes, an electron transport layer and a hole transport layer. The electron transport layer is disposed between the electrodes. The hole transport layer is disposed between the electrodes. The electron transport layer is made of an organic compound having a redox moiety capable of being oxidized and reduced repeatedly. The organic compound is included in a gel layer containing an electrolyte solution which stabilizes a reduction state of said redox moiety.

The electron transport layer of the present invention is made of the organic compound having the redox moiety capable of being oxidized and reduced repeatedly. The organic compound is included in the gel layer. The gel layer contains the electrolyte solution for stabilizing the reductioin state of the redox moiety. In this electron transport layer, it is possible to control the structure at a molecular level for increasing a reaction interface and eventually transport electrons efficiently at a high reaction rate.

In the present invention, the redox (the redox reaction) involves donation and acceptance of electrons by ions, atoms and compounds. The redox moiety refers to a moiety stably donating and accepting electrons by the redox reaction.

The organic compound has the redox moiety. The gel layer is formed of the organic compound swollen with the electrolyte solution. Namely, the gel layer is formed of a tridimensional network structure of the organic compound filled with a liquid in its gel state.

The electron transport layer is made of the organic compound having the redox moiety. The organic compound is arranged to form the gel layer. With this arrangement, it is possible to dispose the redox moiety adjacent to the electrode, and retain the organic compound such that adjacent redox moieties are allowed to come close to each other for exchanging electrons therebetween. Besides, it is possible to dispose the redox moieties within the electron transport layer at a high density for achieving a very large rate constant of an electron self-exchanging reaction, leading to an improved electron-transporting performance. In addition, the electron transport layer can be made of the gel layer of the organic compound for easily having an improved adhesion strength and elasticity as well as light transmission performance.

The organic compound molecule forming the gel layer contains the redox moiety, allowing the redox moieties to continuously exchange electrons therebetween by the repetitive oxidation-reduction reaction. Namely, the organic compound forming the gel layer contains the redox moiety, thereby keeping the gel layer at a moiety suitable for allowing the redox moieties to easily transport electrons. The redox moieties may be positioned at side chains of the organic compound forming the gel layer. Instead, the redox moieties and backbones of the organic compound are positioned alternately. Instead, at least one of the redox moieties and backbones may be consecutively arranged by chemical bonding.

The redox moieties transport electrons through their electron exchange reactions therebetween rather than diffusions. The electron exchange reaction occurs between adjacent redox moieties, such that an oxidized redox moiety oxidizes a reduced redox moiety adjacent to the oxidized redox moiety. It appears to transport electrons within the electron transport layer. The redox moiety of the present invention undergoes the electron exchange between adjacent ones, rather than diffusion, for transporting electrons, and thereby should be distinguished from ion-conductive materials which conduct ions through diffusion. In the electron transport layer of the present invention, adjacent redox moieties need to come close to each other to perform the electron exchange therebetween. In the present invention, the redox moieties are held by the gel layer, and presumably migrate several ongstromes. When the organic compound molecule forming the gel layer contains the redox moiety as in the present invention, the electron exchange between adjacent redox moieties are referred to as electron self-exchange reaction.

Japanese patent application publication No. 07-288142 discloses a photoelectric conversion device which is provided with a solid ion conductor containing redox system within a polymer compound. However, the ion conductor is a hole transport material, rather than an electron transport material. In the electron transport layer of the photoelectric device of the present invention, the redox moiety is held by the gel layer. It enables to extend the reaction interface either for conversion of light into electricity or for conversion of electricity into light, without degenerating its electron transporting performance, thereby giving a high conversion efficiency.

The reaction interface refers to an interface between the electron transport layer and either one of a hole transport material and an electrolyte solution. For example, the photoelectric conversion device is designed to separate charges generated by photo-absorption, at the reaction interface. Thereby, the conversion efficiency of the photoelectric conversion device increases with the dimension of the reaction interface. The dimension of the reaction interface can not be sufficiently extended in conventional devices. In contrast, the electron transport layer of the present invention is formed as the gel layer made of the organic compound which interacts with the electrolyte solution and has the redox moiety. Thereby, in the present invention, it is possible to increase the dimension of the reaction interface between the redox moiety and the electrolyte solution immersed into the electron transport layer, and improve the conversion efficiency. The increase in the dimension of the reaction interface is presumably attributed to two reasons described below. Conventional electron-transporting materials are made of inorganic semiconductors or the like, making it difficult to fragment the inorganic material into fine particles less than nanometer scale. With respect to one of the reasons, the compound forming the electron transport layer in the present invention can be miniaturized at molecular level for the purpose of increasing the dimention of the reaction interface required for the charge separation, as long as the redox moiety can transport electrons by reduction-oxidation. Theoretically, the electron transport layer can be formed with an ongstrome-scale interface, particularly when being made of the organic polymer compound. The other reason is that the electron transport layer is presumably formed with specific interfaces between the redox moiety and at least one of the hole transport layer and the electrolyte solution for prompting the charge separation.

The electron transport layer is formed of the organic compound having the redox moiety, and easily designed and synthesized depending on electrical performances (e.g., electric potential) and structural properties (e.g., molecular size). Thereby, it is possible to control gelatinization and solubility. Besides, the electron transport layer formed of the organic compound does not require a process of sintering at a high temperature which is necessary in formation of electron transport layer made of inorganic substance such as inorganic semiconductor, thereby making its fabrication process favorable. Besides, it is possible to provide the electron transport layer with elastic members. In addition, the organic compounds are free from their extinction problems and have lower toxicities, compared to inorganic materials and noble metal materials. In addition, the organic compounds can be incinerated to produce thermal energies to be utilized.

The electron transport layer is formed of the organic compound included in the electrolyte solution, enabling it to stabilize the reduction state of the redox moiety, and thereby transporting electrons stably. It is generally believed that the organic compounds can be hardly utilized as materials of the electron transport layers due to instability in their reduction states, compared to inorganic compounds such as metal semiconductors and metal oxide semiconductors generally employed as electron-transporting materials. However, when being configured to contain the electrolyte solution, the electron transport layer is allowed to compensate ion-states of the redox moieties resulting from the redox reaction with counter ions within the electrolyte solution. Namely, the electron transport layer is allowed to stabilize cation states of the redox moieties with counter anions within the electrolyte solution. Besides, the solvent can contribute to the stabilization of the reduction states of the redox moieties by its solvation, dipole moment and the like, eventually stabilizing the redox moieties.

The reaction interface of the gel layer in the present invention can be evaluated in terms of swelling degree formulated below, which is a physical index expressing influence on the dimention thereof.

Swelling degree (percent)=a gel weight/a dried gel weight×100

The dried gel refers to gels which are dried by eliminating solution (primally solvent) within the gel. Instead, the gels can be dried by heating, eliminating solution/solvent in vacuum atmosphere, eliminating solution/solvent within the gel by use of other solution/solvent, and so on.

The swelling degree of the gel layer in the present invention is preferably in a range of 110-3000 percent, more preferably 150-500 percent. Otherwise, the gel layer may insufficiently stabilize the redox moiety for lack of electrolyte ingredients within the gel layer when the swelling degree is less than 110 percent, or suffer from poor electron transport performance when the swelling degree is above 3000 percent, leading to poor performance of the device.

In the present invention in accordance with claim 2, the redox moiety of the organic compound is made of a phenoxyl derivative.

When being made of the phenoxyl derivative, the redox moiety enables it to serve high electron transport performance within the electron transport layer due to rapid electron exchange between the phenoxyl derivatives.

In the present invention in accordance with claim 3, the redox moiety of the organic compound is made of a quinone derivative.

When being made of the quinone derivative, the redox moiety enables it to serve high electron transport performance within the electron transport layer because of rapid electron exchange between the quinone derivatives.

In the present invention in accordance with claim 4, the redox moiety of the organic compound is made of an imide derivative.

When being made of the imide derivative, the redox moiety enables it to serve high electron transport performance within the electron transport layer because of rapid electron exchange between the imide derivatives.

In the present invention in accordance with claim 5, the redox moiety of the organic compound is made of a viologen derivative When being made of the viologen derivative, the redox moiety enables it to serve high electron transport performance within the electron transport layer because of rapid electron exchange between the viologen derivatives. Besides, the viologen derivative is solvable in water and highly hydrophilic, and preferably utilized as being easily swollen with water-containing electrolyte solution.

In the present invention in accordance with claim 6, the organic compound has an average molecular weight of 1000 or more.

When being polymerized to have the average molecular weight of 1000 or more, the organic compound is made stable for its high voiling point and its low volatility. Besides, it is possible to improve adhesion strength for laminating the electron transport layer made of the organic compound on the surface of the electrode. In the present invention, the average molecular weight is determined by means of gel permeation chromatography.

In the present invention in accordance with claim 7, the electron transport layer formed of the gel layer has a thickness of 100 nm or more.

In the present invention, the electron transport layer serves to transport electrons at redox moieties, and hardly suffers from recombination of charges. Besides, the electron transport layer is allowed to increase an effective diffusion distance, thereby making it possible to increase a thickness up to 100 nm or more. With the increase in this thickness, it is possible to increase the dimention for the charge separation, leading to increase in the conversion efficiency. Some electron transport materials such as Fullerene exhibits a small diffusion distance, and insufficiently improve a conversion efficiency even when being formed to have the thickness of 100 nm or more.

In the present invention in accordance with claim 8, the hole transport layer contains a stable radical compound.

When containing the stable radical compound, the hole transport layer enables it to transport holes, which are generated at the reaction interface in the vicinity of electron transport layer together with electrons, effectively into the electron transport layer by rapid electron transfer reaction involving the stable radical compound, eventually improving the conversion efficiency.

The present invention in accordance with claim 9 further comprises a dye provided on the electron transport layer to be formed as a dye-sensitized solar cell. The dye is provided at an interface between the electron transport layer and the hole transport layer.

As mentioned above, the electron transport layer in the present invention gives a superior electron transport performance as well as a sufficiently large dimensional interface, enabling to provide a dye-sensitized solar cell with superior conversion efficiency.

Advantageous Effects of Invention

According to the present invention, the electron transport layer is made of an organic compound having a redox moiety capable of being oxidized and reduced repeatedly. The organic compound is included in a gel layer containing an electrolyte solution which stabilizes a reduction state of the redox moiety. This invention makes it possible to increase a reaction interface, and transport electrons efficiently at a high reaction rate, and thereby to provide a photoelectric device with superior photoelectric conversion efficiency.

DETAILED DESCRIPTION OF THE INVENTION

Figure 1:
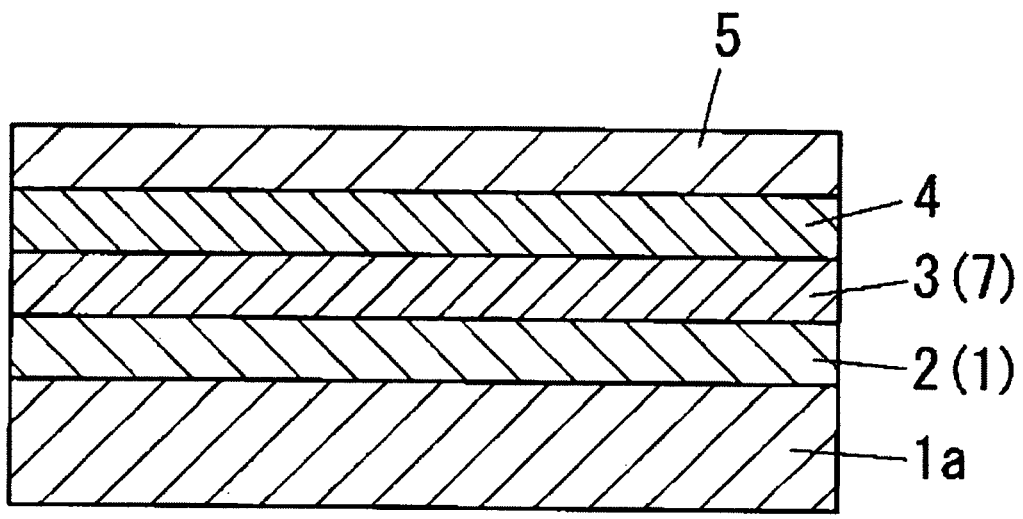
FIG. 1 illustrates a schematic sectional view of one example of an embodiment of the present invention.

Hereafter, the present invention is explained in detail.

A photoelectric device of the present invention comprises a pair of electrodes, an electron transport layer and a hole transport layer. The electron transport layer is disposed between the electrodes. The hole transport layer is disposed between the electrodes. The electron transport layer is formed of an organic compound containing a redox moiety. The organic compound is swollen with an electrolyte solution to form a gel layer. In other words, the electron transport layer is formed as the gel layer containing the organic compound which has the redox moiety.

The redox moiety is formed as a moiety of a molecule of the organic compound, and the gel moiety is formed as another moiety thereof. The redox moiety is chemically linked to the gel moiety. The redox moiety is not required to be in a particular position with respect to the gel moiety. When the gel moiety is positioned at a main chain forming a molecule backbone, the redox moiety is positioned at a side chain linked to the main chain. The organic compound may contain the molecular backbone serving as the gel moiety and a molecular backbone serving as the redox moiety which are linked to each other alternately. When the redox moiety and the gel moiety are disposed within one molecule of the organic compound, the redox moiety are held at a portion suitable for easily transporting electrons, by the gel layer forming the electron transport layer.

The organic compound containing the redox moiety and the gel moiety may be formed of a low molecular weight form or a hight molecular weight form. When the organic compound is formed of the low molecular weight form, a low molecular weight gel can be employed as a material forming a hydrogen bond linked to the organic compound. When being formed of the high molecular weight form, the organic compound preferably has an average molecular weight of 1000 or more, for simultaneously exhibiting a gel function.

The organic compound is not limited to a particular maximum of molecular weight, but preferably selected to have a molecular weight of one million or less. The gel layer is preferably in the form of konjac food or an ion-exchange film, but not limited to a particular gel form.

In the present invention, the redox moiety refers to a pair of an oxidant and a reductant involving a revesible redox reaction. When being formed of a pair of the oxidant and the reductant, the redox moiety is not required to be formed of particular substances. The redox moiety is preferably formed of a pair of an oxidant and a reductant having the same valence as that of the oxidant.

The organic molecule containing both the redox moiety and the gel moiety within its one molecule are expressed as the following formula.

$(X_i)_{nj}:Y_k$

Symbols "$(X_i)_n$" and "$(X_i)_{nj}$" denote gel moieties. $X_i$ denotes a monomer of the compound forming the gel moiety, which can be formed as a polymer backbone. The polymerization number "n" is preferably in a range of one to one billion. "Y" denotes the redox moiety bonded to "X". Symbols, j and k, are arbitrary integers respectively denoting the numbers of $(X_i)_n$ and Y within one molecule, and preferably in a range of one to one billion. The redox moieties "Y" may be bonded to arbitrary portions of the polymer backbone containing the gel moieties, "$(X_i)_n$" and "$(X_i)_{nj}$". The redox moiety Y may contain different kinds of materials, but preferably contains materials having almost the same redox potentials, in this case, in consideration of the electron exchange.

The organic compound which has such redox moieties and gel moieties "$(X_i)_n$" and "$(X_i)_{nj}$" within one molecule can be suitably selected from polymers containing quinone derivatives, polymers containing imide derivatives, polymers containing phenoxyl derivatives, polymers containing viologen derivatives and so on.

The following molecules expressed by formulas 1-4 are given as examples of polymers having quinone derivative backbones which are formed of quinones chemically bonded to each other. In the molecules expressed by the formulas 1-4, a substituent R is selected from saturated or unsaturated hydrocarbons (e.g., methylene, ethylnene, propane-1,3-dienyl, ethylidene, propane-2,2'-diyl, alkane diyl, benzilydene, propyrene, vinylidene, propene-1,3-diyl and but-1-en-1,4-diyl), cyclohydrocarbons (e.g., cyclohexane diyl, cyclohexene diyl, cyclohexadiene diyl, phenylene, naphthalene and biphenylene), ketos (e.g., oxalyl, malonyl, succinyl, gultanyl, azipoyl, alkane dioyl, sebacoyl, fumaroyl, maleoyl, phthaloyl, isophthaloyl and telephthaloyl), divalent acyl groups, ethers (e.g., oxy, oxymethylenoxy and oxycarbonyl), esters, sulfer-containing groups (e.g, sulfandiyl, sulfanyl, sulfonyl), nitrogen-containing groups (e.g, imino, nitriro, hydrazo, azo, azino, diazoamino, urylene and amido), silicon-containing groups (e.g., silane diyl and disilane-1,2-diyl). The listed compounds may be substituted with other groups at their terminals, or combined with each other to form the substituent R. In the compound expressed by the formula 1, anthraquinone is chemically bonded to a polymer main chain. In the compound expressed by the formula 2, anthraquinone is employed as a repetitive unit of a polymer main chain. In the compound expressed by the formula 3, anthraquinone is employed as a cross-linking unit. In the compound expressed by the formula 4, anthraquinone serves as a proton-donating group which forms a hydrogen bond together with an oxygen atom.

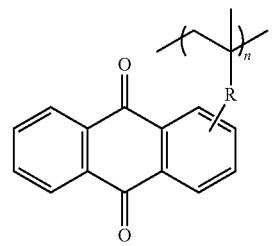

(Formula 1)

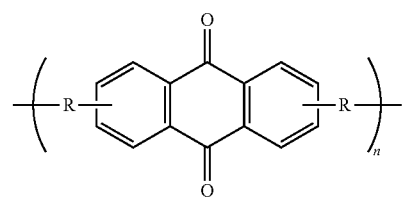

(Formula 2)

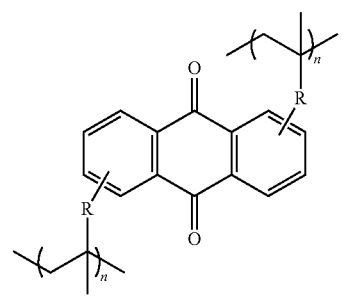

(Formula 3)

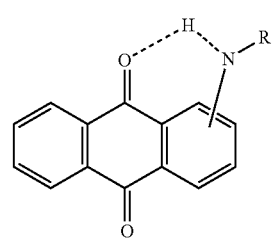

(Formula 4)

Polyimides expressed by formulas 5 and 6 are given as examples of polymers having imide derivative backbones which contains imides as the redox moiety Y. In the formulas 5 and 6, substituents $R_1$-$R_3$ are selected from aromatic substituents (e.g., phenylnene groups), aliphatic chains (e.g., alkylene groups and alkylether) and ethers. In the polyimide polymer backbones, the substituents $R_1$-$R_3$ may be crosslinking portions. Instead, the polymers having imide derivative backbones may have no crosslinking moiety as long as the polymer is swollen with but not dissolved into the employed solvent. The crosslinking moieties serve as the gel moieties $(X_i)_n$ and $(X_i)_{nj}$. When having crosslinked portions, the polymer may contain an imide group within the crosslinking unit. The imide group is preferably selected from phthalimides and pyromellitimides, as long as the polymer exhibits the electrochemically reversible redox performance.

(Formula 5)

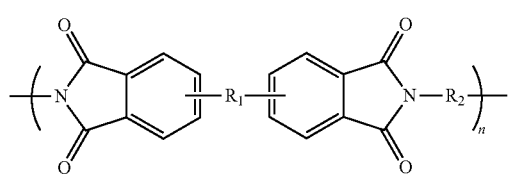

(Formula 6)

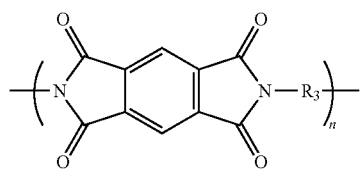

Galvino compound expressed by formula 7 is given as an example of a phenoxyl-containing phenoxyl derivative backbone. In this galvino compound, a galvinoxyl group (see formula 8) corresponds to the redox moiety Y. The polymer backbone corresponds to the gel moieties $(X_i)_n$ and $(X_i)_{nj}$.

(Formula 7)

(Formula 8)

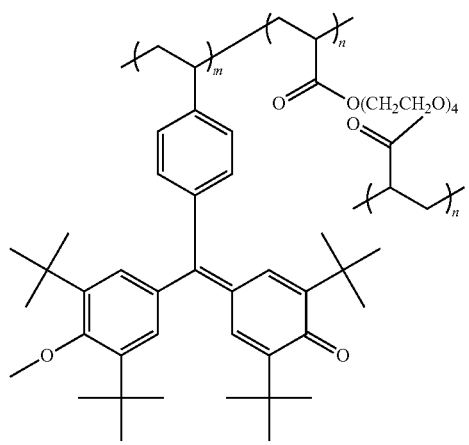

Polyviologen polymers expressed by Formulas 9 and 10 are given as examples of the polymer having viologens derivative backbones containing viologen. In the polyviologen polymer, the substituent expressed by formula 11 corresponds to the redox moiety Y. The polymer backbone corresponds to the gel moieties $(X_i)_n$ and $(X_i)_{nj}$.

(Formula 9)

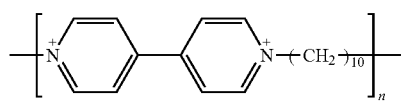

(Formula 10)

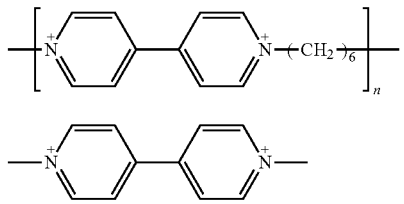

(Formula 11)

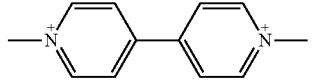

Symbols "m" and "n" in the above formulas 1-7 and 9-10 denote monomer polymerization degrees, and are preferably in a range of one to one billion.

As described above, the organic compound having both the redox moiety and the polymer backbone is swollen with the electrolyte solution at between polymer backbones to form the gel layer. When containing the electrolyte solution, the electron transport layer made of the organic compound makes it possible to compensate the ion state formed by the redox reaction in the redox moiety, by use of counter ions dissolved in the electrolyte solution. Accordingly, it is possible to stabilize the redox moiety.

The electrolyte solution contains the electrolyte and the solvent. The electrolyte is formed of either one or both of a support salt and a pair of the oxidant and the reductant involving the redox reaction. The support salt (support electrolyte) may be one selected from ammonium salts (e.g., tetrabutylammonium perchlorate and tetrabutylammonium hexafluorophosphate), ammonium salts (e.g., imidazolium salts and pyridium salts), alkali metal salts (e.g., lithium perchlorate and potassium tetrafluorinated borate) and so on. The pair of the oxidant and the reductant refers to a pair of the oxidant and the reductant acting in reversible redox reaction. The pair of the oxidant and the reductant is not limited to a particular pair, and can be selected from a chlorine compound-chlorine pair, a iodine compound-iodine pair, a bromine compound-bromine pair, a thallium ion (III)-thallium ion (I) pair, a mercury ion (II)-mercury ion (I) pair, a ruthenium ion (III)-ruthenium ion (II) pair, a copper ion (II)-copper ion (I) pair, an iron ion (III)-iron ion (II) pair, a nickel ion (II)-nickel ion (III) pair, a vanadium ion (III)-vanadium ion (II) pair, a manganate ion-permanganate ion pair, and so on. In this case, the pair of the oxidant and the reductant is distinguished from the redox moiety within the electron transport layer. The electrolyte solution may be gelatinized or solidified.

The solvent forming the electrolyte solution contains at least one of water, organic solvent and ion liquid.

When containing water and organic solvent as the solvent, the electrolyte solution enables it to stabilize the reduction state of the redox moiety of the organic compound, thereby transporting electrons stably. The electrolyte solution may contain water and organic solvent, but preferably contains an ion-conductive organic solvent for further stabilizing the redox moiety. For example, the organic solvent can be selected from carbonate compounds (e.g., di methylcarbonate, diethylcarbonate, methylethylcarbonate, ethylenecarbonate and propylenecarbonate), ester compounds (e.g., methyl acetate, methyl propionate and y(gamma)-butyrolactone), ether compounds (e.g., diethylether, 1,2-dimethoxyethane, 1,3-dioxosilane, tetrahydorofuran and 2-methyltetrahydrofuran), heterocyclic compounds (e.g., 3-methyl-2-oxazolidinone and 2-methylpyrrolidone), nitrile compounds (e.g., acetonitrile, methoxyacetonitrile and propyonitrile), aprotic non-polar compounds (e.g., sulfolane, dimethylsulfoxide and dimethylformamide) and so on. The organic solvent may be formed of one of above-listed substances or a mixture thereof. The organic solvent is preferably selected from carbonate compounds (e.g, ethylene carbonate and propyrene carbonate), heterocyclic compounds (e.g., γ (gamma)-butyrolactone, 3-methyl-2-oxazolidinone and 2-methylpyrrolidone) and nitrile compounds (e.g., acetonitrile, methoxyacetonitrile, propyonitrile, 3-methoxypropyonitrile and valeronitrile).

When the ion liquid is employed as the solvent in the electrolyte solution, it is possible to stabilize the redox moiety. Ion liquid exhibits a superior stability for its non-volatile and inflammable properties. Conventional ion liquids can be employed as the ion liquid in the present invention. Ion liquid in the present invention may be one selected from imidazoliums (e.g., 1-ethyl-3-methylimidazoliumtetracyanoborate), pyridines, alicyclic amines, aliphatic amines, ion liquids (e.g., azoniumamines) and other substances which are listed in a specification of European patent publication No. 718288; a pamphlet of international disclosure WO95/18456; Electrochemistry Vol. 65, No. 11, page 923, 1997; J. Electrochem. Soc. Vol. 143, No. 10, page 3099, 1996; Inorg. Chem. Vol. 35, page 1168, 1996; and so on.

The electrode is provided at its surface with the gel layer made of the organic compound having the redox moiety to from the electron transport layer. In the electron transport layer of the present invention, electrons are allowed to serve as dopants. The electron transport layer of the present invention contains the redox moiety which has an electric potential larger than +100 mV with respect to that of a silver/silver chloride reference electrode or the like.

The electron transport layer is preferably formed to have a thickness in a range of 10 nm to 10 mm, in view of its electron-transporting performance. More preferably, the electron transport layer is formed to have a thickness in a range of 100 nm to 100 μm (micrometers) for both improving the electron-transporting performance and increasing the dimention of the interface.

Wet-type process is preferably employed to concisely form the electron transport layer on the surface of the electrode at a reduced cost. When being made of polymer organic compound having an average molecular weight of 1000 or more, the electron transport layer is preferably formed by wet-type process in view of molding. The wet-type process may be a spincoat method, a drop-cast method in which liquid is dropped and evaporated, a printing method (e.g., screen printing, grabbier printing), a spattering, a vapor process (e.g., deposition method), or the like.

In the present invention, the electrode is electrically connected to the electron transport layer, and supplies electrons from the electron transport layer to outside portions, such as source circuit, secondary battery, capacitor which are electrically connected to the device. As well, the electrode injects electrons into the electron transport layer, physically retaining the electron transport layer.

The electrode can be formed of a metal itself, or a laminate of a dielectric substrate (e.g., glass and film) and an electrically conductive material formed on the substrate. The electrically conductive material is preferably selected from metals (e.g., Pt, Au, Ag, Cu, Al, Rh and In), carbon, electrically conductive metal oxides (e.g., an In—Sn composite oxide, a tin oxide doped with Sb, a tin oxide doped with F, composite materials of these compounds, and materials of these compounds which are coated with silicon oxide, tin oxide, titanium oxide, zirconium oxide, aluminum oxide, or the like. The electrode preferably has a low surface-resistance 200 ohms or less per square, more preferably 50 ohms or less per square. The minimum of the surface-resistance of the electrode is not limited to a particular value, but is generally set to be 0.1 ohms per square.

With the use of the photoelectric device of the present invention in which the electron transport layer and the hole transport layer are interposed between electrodes, it is possible to prepare electricity-generating devices utilizing the photoelectric conversion (e.g., photobatteries and solar batteries), luminescence devices (e.g., organic ELs), photodisplaying device (e.g., electrochromic displaying devices and electronic papers), photo-sensitized devices, thermo-sensitized devices, and photoelectric devices.

When being formed on the electrode, the substrate is preferably selected to exhibit a high light transmission for the purpose of passing light therethrough. The light transmission of the electrode is preferably 50 percent or more, more preferably 80 percent or more, for light having a 500 nm wavelength. The electrode is preferably formed to have a thickness in a range of 0.1 to 10 μm (micrometers). In this range, it is possible to prepare the electrode having an even thickness, without lowering the light transmission, thereby allowing the light to be sufficiently directed towards the electron transport layer.

The electrode may be formed of a transparent electrically-conductive oxide on the substrate. FIG. 1 illustrates one example of the photoelectric device in which the electrode is formed of a layer made of the transparent electrically conductive oxide. In preparation of the the electrode, an oxide (e.g., indium oxide, tin oxide and zinc oxide) is deposited onto the light-transmissive substrate 1a made of glass, resin or the like, by the vacuum process (e.g., vapor deposition), spattering method, spincoat method, spray method and wet-type process (e.g., screen printing), so as to provide the transparent electrically-conductive oxide layer 2 which is formed into a film as the electrode 1. Then, the electron transport layer 3 containing the gel layer 7 is formed on the resultant electrode 1 by the wet-type process or the like. Subsequently, the hole transport layer 4 and the electrode 5 are superimposed on the electron transport layer 3. Through this process, it is possible to form the transparent electrically-conductive oxide layer 2 acting as the electrode 1 on the light-transmissive substrate 1a, then form the electron transport layer 3 on a surface of the electrode 2. With this configuration in the present invention, the device enables it to propagate outwards light from the substrate 1a through the electrode 1 made of the transparent electrically conductive oxide layer 2. Besides, this device enables it to extract and inject electrons from/into the electrode 1 made of the transparent electrically-conductive oxide layer 2. This device can be effectively employed to radiate/extract light and extract/inject electrons within a common plane in the photosensors, electricity-generating devices, the luminescence devices and so on.

Besides, it is possible to prepare the photoelectric device in which the electron transport layer and the hole transport layer made of an electrolyte liquid are formed between the electrode and a counter electrode.

The material forming the counter electrode is suitably selected, depending on the resultant device. This material can be selected from metals (e.g., Pt, Au, Ag, Cu, Al, Rh and In), carbon materials (e.g., graphite, carbon nanotube and Pt-supporting carbon), electrically conductive metal oxides (e.g., an In—Sn composite oxide, a tin oxide doped with Sb and a tin oxide depoed with F), electrically conductive polymers (e.g., polyethylenedioxythiophene, polypyrrole and polyaniline) and so on.

The hole transport layer is formed of an electrolyte liquid containing a hole transport material. The electrolyte liquid forming the hole transport layer can be formed of the aforementioned electrolyte solution containing the electrolyte, which is employed to swell the organic compound having the redox moiety for formation of the gel layer. The solvent in the electrolyte solution may be aqueous solution or organic solvent, but is preferably organic solvent for stabilizing the pair of oxidant and the reductant. For example, the solvent can be selected from carbonate compounds (e.g., dimethylcarbonate, diethylcarbonate, methylethylcarbonate, ethylenecarbonate, propylenecarbonate), ester compounds (e.g., methyl acetate, methyl propionate and γ (gamma)-butyrolactone), ether compounds (e.g., diethylether, 1,2-dimethoxyethane, 1,3-dioxosilane, tetrahydorofuran and 2-methyltetrahydrofuran), heterocyclic compounds (e.g., 3-methyl-2-oxazodilinone and 2-methylpyrrolidone), nitrile compounds (e.g., acetonitrile, methoxyacetonitrile and propyonitrile), aprotic polar solvents (e.g., sulfolane, dimethylsulfoxide and dimethylformamide) and so on. The organic solvent may be formed of one of these substances or a mixture thereof. Among these substances, the solvent is preferably selected from carbonate compounds (e.g, ethylene carbonate and propyrene carbonate), heterocyclic compounds (e.g., γ (gamma)-butyrolactone, 3-methyl-2-oxazodilinone and 2-methylpyrrolidone) and nitrile compounds (e.g., acetonitrile, methoxyacetonitrile, propyonitrile, 3-methoxypropyonitrile and valeronitrile).

Figure 2:
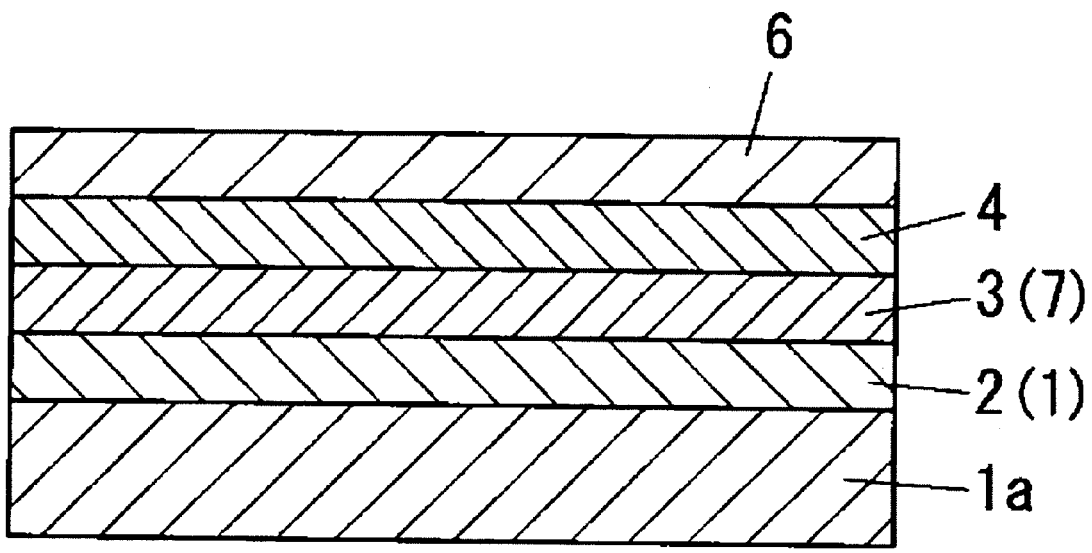
FIG. 2 illustrates a schematic sectional view of another example of an embodiment of the present invention.

The photoelectric conversion device is one example of photoelectric device in which the electron transport layer and the hole transport layer made of the electrolyte liquid between the electrode and the counter electrode. FIG. 2 illustrates one example of the photoelectric conversion device. The electrode 1 can be formed in the same way as the photoelectric device illustrated in FIG. 1. Namely, the transparent electrically-conductive oxide layer 2 is formed as the electrode 1 on the light-transmissive substrate 1a. Then, the electron transport layer 3 containing the gel layer 7 is superimposed on the resultant electrode 1. Subsequently, the hole transport layer 4 and the counter electrode 6 are superimposed on the electron transport layer 3. When exposed to light at the transparent electrically-conductive oxide layer 2 of the electrode 1 through the substrate 1a, the resultant photoconversion device enables it to generate excited electrons and holes at an interface between the electron transport layer 3 and the hole transport layer 4. In this photoconversion device, the generated electrons are allowed to flow into the electrode 1 through the electron transport layer 3, and then propagated outside through the electrode 1. Simultaneously, the generated holes are allowed to flow into the counter electrode 6 through the hole transport layer 4, and then propagated outside through the counter electrode 6.

The photoelectric conversion device may be provided with a dye in contact with the electron transport layer 3 for efficiently absorbing visible light and near-infrared light. Such a dye is disposed at an interface between the electron transport layer 3 and the hole transport layer 4. The electron transport layer 3 of the present invention is formed as the gel layer 7 made of the organic compound having the redox moiety swollen with the electrolyte solution. The hole transport layer 4 is formed of the same electrolyte solution as that of the electron transport layer 3. Thereby, the electrolyte solution is impregnated within the gel layer 7 forming the electron transport layer 3, and serves as a portion of the hole transport layer 4. Thereby, the dyes can be adhered, adsorbed, or bonded to a surface of the electron transport layer 3 made of the organic compound for providing the dye at the interface between the electron transport layer 3 and the hole transport layer 4. It is possible to prepare the dye-sensitized photoelectric conversion device, by applying the dye to the device.

Conventional materials can be employed as the dye. The dye can be selected from 9-phenylxanthene dye, coumarin dye, acrylidine dye, triphenylmethane dye, tetraphenylmethane dye, quinone dye, azo dye, indigo dye, cyanine dye, melocyaninedye, xanthene dye, and so on. Instead, the dye can be selected from transition metal complexes such as $RuL_2(H_2O)_2$-typed ruthenium-cis-diaqua-bipyridyl complex (wherein L is 4,4'-dicarboxyl-2,2'-bipyridine), ruthenium-tris ($RuL_3$), ruthenium-bis ($RuL_2$), osmium-tris ($OsL_3$), osmium-bis ($OsL_2$), and zinc-tetra(4-carbophenyl)porphyrin, iron-hexacyanide complex, phthalocyanine, and so on. Instead, the dye may be one listed in "FPD DSSC Latest technologies and material development of photomemory and functional dye (NTS Inc.)", DSSC chapter. The dye is preferably one exhibiting association performance on the semiconductor, for covering the semiconductor surface therewith ro facsiliate the charge separation during photoelectric conversion. The dye is preferably one exhibiting the association performance such as a dye expressed by formula 12.

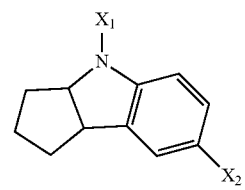

[Formula 12]

In the above formula, each of $X_1$ and $X_2$ contains at least one of alkyl group, alkenyl group, aralkyl group, aryl group and heterocycle, and may contain substituents. The dye expressed by formula 12 is known as a association-typed dye. In this case, it is possible to decrease a dimension required for recombining the electrons in the electron transport material with the holes in the hole transport material, for achieving an improved conversion efficiency of the photoelectric conversion device.

The hole transport material forming the hole transport layer 4 may be a solution containing a pair of redox, and a solid electrolyte such as melting salt, a p-type semiconductor such as copper iodide, amine derivatives (e.g., triphenylamine), electrically conductive polymers (e.g, polyacethylene, polyaniline, polytiophene) and so on.

The hole transport layer 4 may contain a stable radical compound. When containing the stable radical compound, the hole transport layer 4 enables it to efficiently transport holes into the counter electrode by utilizing a rapid electron transfer reaction of the stable radical compound.

The stable radical compound is a chemical species having an unpaired electron (i.e., radical), and not limited to a particular species. The stable radical compound is preferably a radical compound having nitroxide (NO.). Besides, the radical compound preferably has an average molecular weight of 1000 or more for being solid or solid-like compound with a significantly small volatility at ambient temperature, in view of stability of device.

Further explanations are given as to the stable radical compound. The stable radical compound generates a radical compound during at least one of electrochemical oxidation reaction and reduction reaction. The radical compound is not limited to a particular one, but is preferably a stable radical compound. The radical compound is preferably an organic compound containing at least one of structural units expressed by formulas 13 and 14.

[Formula 13]

In this formula, substituent $R^1$ is selected from substituted or unsubstituted $C_2$-$C_{30}$ alkylene groups, $C_2$-$C_{30}$ alkenylene groups and $C_4$-$C_{30}$ arylene groups. X is selected from oxyradical groups, nitroxyl radical groups, sulfur radical groups, hydrazyl radical groups, carbon radical groups, and boron radical groups. $n^1$ is an integer more than one.

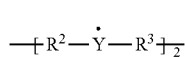
[Formula 14]

In the above formula, substituents $R^2$ and $R^3$ are independently selected from substituted/unsubstituted alkylene groups each having 2-30 carbon atoms, alkenylene groups each having 2-30 carbon atoms, or arylene groups each having 4-30 carbon atoms. Y is a nitroxyl radical group, a sulfur radical group, a hydrazyl radical group or a carbon radical group. $n^2$ is an integer more than one.

The radical compounds expressed by the formulas 13 and 14 can be selected from oxyradical compounds, nitroxyl radical compounds, carbon radical compounds, nitrogen radical compounds, boron radical compounds, sulfur radical compounds, and so on. The organic compound generating at least one of structural units expressed by the formulas 13 and 14 preferably has an average molecular weight of $10^3$ to $10^7$, more preferably $10^3$ to $10^5$.

The oxyradical compound can be selected from aryloxy radical compounds expressed by formulas 15 and 16, a semi-quinone radical compound expressed by formula 17, and so on.

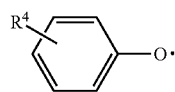
[Formula 15]

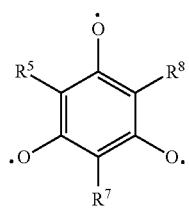
[Formula 16]

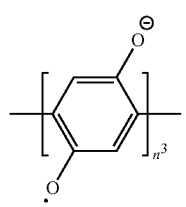
[Formula 17]

In the compounds expressed by formulas 15-17, substituents $R^4$, $R^5$, $R^6$ and $R^7$ are independently selected from hydrogen atoms, substituted/unsubstituted aliphatic (or aromatic) hydrocarbon groups each having 1-30 carbon atoms, halogen groups, hydroxyl groups, nitro groups, nitroso groups, cyano groups, alkoxy groups, aryloxy groups, and acyl groups. In the compound expressed by formula 17, $n^3$ is an integer more than one. The organic compound generating a radical compound having one of the structural units expressed by the formulas 15-17 preferably has an average molecular weight of $10^3$ to $10^7$.

The nitroxide radical compounds can be selected from radical compounds having piperidinoxy rings (e.g., a radical compound having a unit expressed by formula 18), radical compounds having pyrrolidinoxyl rings (e.g., a radical compound having a unit expressed by formula 19), radical compounds having a pyrrolinoxy ring (e.g., a compound having a unit expressed by formula 20), radical compounds having nitronylnitroxide structures (e.g., a radical compound having a unit expressed by formula 21).

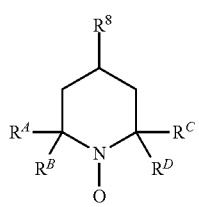
[Formula 18]

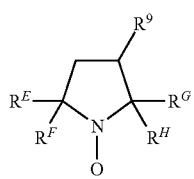
[Formula 19]

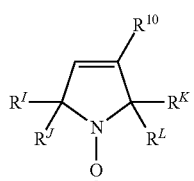
[Formula 20]

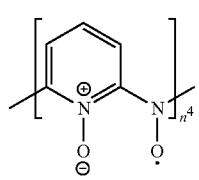
[Formula 21]

In the compounds expressed by formulas 18-20, substituents $R^{8\text{-}10}$ and $R^{A\text{-}L}$ are independently selected as substituents in formulas 15-17. In the unit expressed by formula 21, $n^4$ is an integer more than one. The organic compound generating a radical compound having one of the structural units expressed by the formulas 18-21 preferably has an average molecular weight of $10^3$ to $10^7$.

The nitronylnitroxide radical compound can be selected from radical compounds having trivalent hydorazine groups (e.g., a group expressed by formula 22), radical compounds having trivalent pheldazyl groups (e.g., a group expressed by formula 23), and radical compounds having aminotriazine structures (e.g., a group expressed by formula 24).

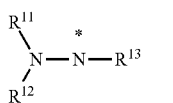
[Formula 22]

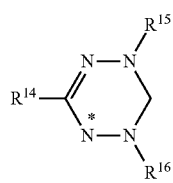
[Formula 23]

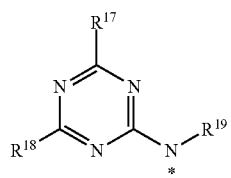
[Formula 24]

In the compounds expressed by formulas 22-24, substituents $R^{11-19}$ are independently selected as substituents in formulas 15-17. Preferably, the organic compound generating a radical compound having one of the structural units expressed by the formulas 22-24 has an average molecular weight of $10^3$ to $10^7$.

More preferably, the organic compound generating a radical compound having one of the structural units expressed by the formulas 13-24 has an average molecular weight of $10^3$ to $10^7$, for exhibiting superior stability and being stably utilized as the photoelectric conversion device and an energy accumulation device. Thereby, it is possible to easily provide a photoelectric device with a superior stability and a rapid response.

More preferably, the organic compound may be one which is solid in ambient temperature and selected among the above-listed organic compounds, for stably keeping the radical compound in contact with the semiconductor. Thereby, it is possible to suppress a minor reaction with other chemical substances, degenerations and degradation due to melting and diffusion, for providing a photoelectric device with a superior stability.

EXAMPLE

Next, the present invention is specifically described with reference to the following Examples.

Example 1

The Galvi compound described above was synthesized in accordance with the following scheme, formula 25.

[Formula 25]

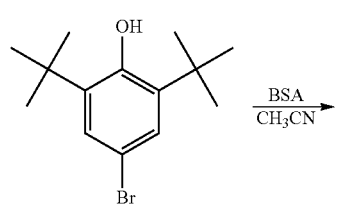

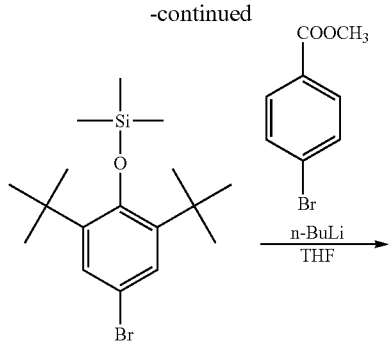

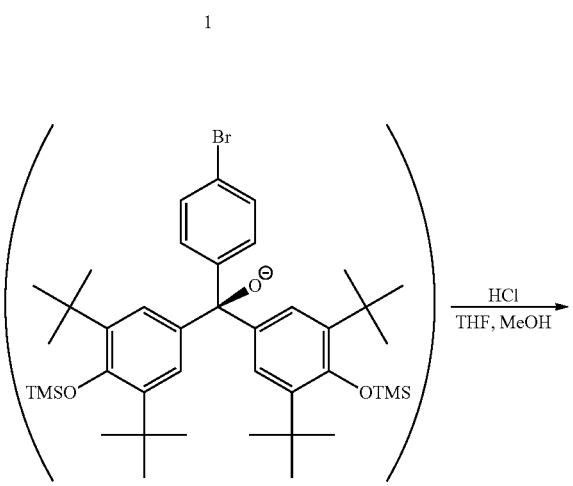

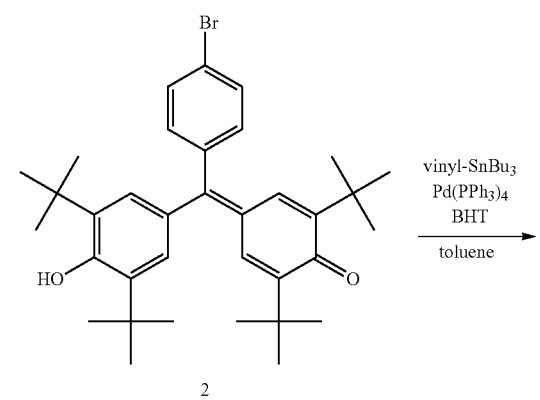

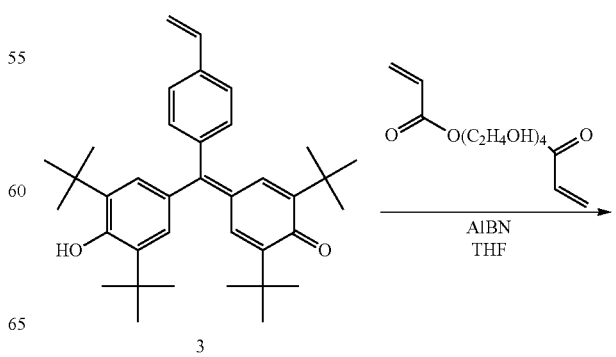

-continued

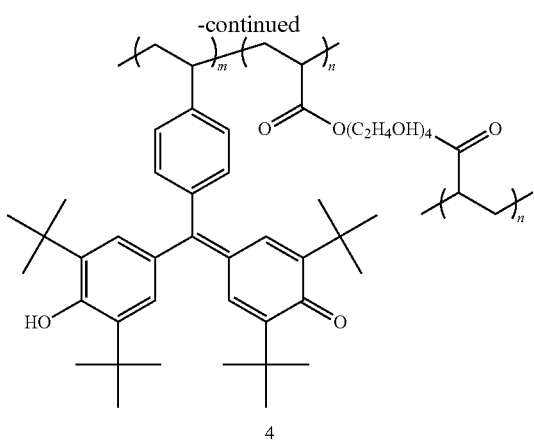

4

(Synthesis of Galvi Monomer)

First, acetonitrile (270 ml) was added into 4-bromo-2,6-di-tert-butylphenol (135.8 g, 0.476 mol). Then, N,O-bis(trimethylsilyl)acetoamide (BSA) (106.3 g, 129.6 ml) was added into the resultant solution under inert atomosphere, then stirred overnight at 70° C. to proceed reaction for completely depositing white crystal therein. The white crystal was extracted by filtration and then subjected to vacuum-drying. Subsequently, the dried crystal was purified with ethanol by recrystalization to yield (4-bromo-2,6-di-tert-butylphenoxy)trimethylsilane (150.0 g, 0.420 mol) expressed by number "1" in formula 25 as a white plate crystal.

The resultant (4-bromo-2,6-di-tert-butylphenoxy)trimethylsilane (9.83 g, 0.0275 mol) was dissolved into tetrahydrofuran (200 ml) under inert atomosphere, and then cooled to −78° C. with a mixture of dry ice and methanol. n-buthyl-lithium/hexane solution (1.58 M, 15.8 ml, 0.025 mol) was added into the cooled solution, and then stirred at 78° C. for 30 minutes. After lithiation, methyl 4-bromobenzoate (1.08 g; 0.005 mol, Mw: 215.0, TCl) dissolved into tetrahydrofuran (75 ml) was added into the resultant solution and then stirred at temperatures varying from −78° C. up to ambient temperature. At the same time, the reaction solution was turned from yellow into deep blue exhibiting the presence of produced aniline, through faint yellow. After the reaction, saturated ammonium chloride solution was added into the reaction solution such that the reaction solution turned yellow, and then extracted with a mixture of ether and water so as to obtain viscous yellow liquid.

Next, a stir bar were added into a mixture of THF (10 ml) and methanol (7.5 ml), and the resultant product were dissolved thereinto. Then, 10N-HCl was slowly added into the solution such that the solution turned reddish orange. After that, the resultant solution was stirred for 30 minutes in ambient temperature. Subsequently, the resultant solution was subjected to solvent evaporation, extraction with hexane/chloroform mixture, solvent evaporation, and column chromatography (hexane/chloroform=1/1) for separation, and recrystalization with hexane, so as to yield (p-bromophenyl) hydrogalvinoxyl (2.86 g, 0.0049 mol) as an orange crystal.

Next, the resultant product (p-bromophenyl)hydrogalvinoxyl (2.50 g, 4.33 mmol) were dissolved into toluene (21.6 ml; 0.2 M). Immediately after that, 2,6-di-tert-butyl-p-cresol (4.76 mg; 0.0216 mmol), tetrakis(triphenylphosphine)palladium (0) (0.150 g; 0.130 mmol), and tri-n-butylvinyltin (1.65 g; 5.20 mmol, Mw: 317.1, TCl) were dissolved into the resultant solution, and subsequently stirred for 17 hours while heated up to 100° C.

Next, the resultant product were extracted within ether/water mixture, and subjected to solvent evaporation and flash column chromatography (hexane/chloroform=1/3) for separation. The separated product was recrystallized within hexane for prefication to yield p-hydrogalvinoxylstylene (1.54 g, 2.93 mmol) expressed by number "3" in formula 25, as an orange fine crystal.

(Synthesis of Galvi Monomer)

The resultant product, galvi monomer (p-hydrogalvinoxylstylene) 1 g, tetraethyleneglycol diacrylate 57.7 mg and azobisisobutyronitrile 15.1 mg were dissolved into tetrahydrofuran 2 ml. Then, the resultant solution was substituted with nitrogen, and fluxed overnight for polymerizing galvi monomer, so as to yield a galvipolymer expressed by number "4" in formula 25. The resultant galvipolymer has an average molecular weight of 10000.

The glass substrate 1a having a 1 nm thickness was formed at its surface with a transparent electrically conductive oxide layer 2 made of fluorine-doped $SnO_2$, which serves as an electrode 1 (available from Asahi glass Co., ltd., 10 ohms per square).

The resultant galvi polymer 22.5 mg were dissolved into chloroform 4.5 ml, and then resultant solution was dropped on the surface of the electrode 1 by drop-casting to be formed into a film having a 100 nm thickness.

Next, galvi compound was electro-oxidized by applying an electric voltage of 1.5 V or less to the electrode 1 so as to be formed into radical, in formation of an electron transport layer 3 made of galvinoxyradical compound on the surface of the electrode 1.

The laminate of the electrode 1 and the electron transport layer 3 was set into an electrochemical measurement tank which contains the electrode 1 as a working electrode, a Pt-wiring electrode as a counter electrode, a silver-silver chloride electrode as a reference electrode, and lithium perchloride as a support electrolyte solution. Then, cyclicvoltammetry measurement was performed to give a stable reversible redox wave which exhibits the presence of galvinoxyl radical at 0V with reference to the reference electrode and confirms an n-type working. The amount of electrons at the electrodes during the reduction was proved to be substantially equal to the theoretical amount thereof calculated from the number of radical sites (obtained from the amount of application). It demonstrate a quantitative reaction of the galvinoxyl radical. The redox wave was stably observed by repetitive application of electric voltage (40 cycles), confirming stable working.

Next, saturated acetonitrile solution of D131 dye shown in formula 24 was applied to the the resultant electron transport layer 3 by spin-coating in order to apply the dye to the electron transport layer.

[Formula 26]

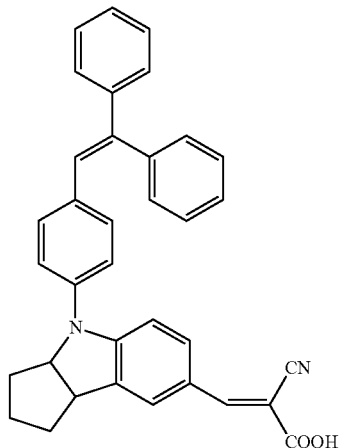

After scraping material of the electron transport layer 3 attached at circumference of the electrode 1, thermo-melting adhesive (available as "Bynel" from Du pont-Mitsui polychemicals Co., Ltd.) was disposed as an encapsulating resin around the electron transport layer 3. Next, a counter Pt-electrode 6 was disposed oppositely to the electrode 1 which was drilled at its center by a diamond drill to have an opening. The D131 dye expressed by the formula 24 (5 mmol/l), 2,2,6,6-tetramethylpiperidine-1-oxyl (TEMPO) 0.1 mmol/l, N-methylbenzimidazole 1.6 mmol/l and lithium perchloride 0.1 mmol/l were dissolved into acetonitrile to obtain a solution. The resultant solution was poured through the above opening. Then, the hole was encapsulated with UV-curing resin, so as to obtain a dye-sensitized solar cell (see FIG. 2).

The photoelectric conversion device fabricated above was subjected to 200 lx of light by means of a phosphorescent lamp (available as "FLR20S, W/M" from Panasonic Co.), so as to give an open-circuit voltage (OCP) of 500 mV. The device gives a voltage converged to 0 mV when shielded from light. The device gives a voltage converged to 500 mV when exposed to light again. The device was proved to stably exhibit such a reversible photoresponse behavior.

According to the chronoamperometry (CA measurement) in response to a 50 mV electric voltage applied to the device, the device gives a photo-induced current of ca. 0.5 μA (microamperes) per square centimeter when subjected to 200 lx of light. The device gives a current converged to 0 A per square centimeter when shielded from the light. The device gives the photo-induced current of ca. 0.5 μA (microamperes) per square centimeter when subjected to the light again. The photoresponse was proved to be stably repeated (40 cycles).

Example 2

The above-mentioned quinine polymer expressed by the formula 4 was synthesized in accordance with the following scheme expressed by a formula 27.

[Formula 27]

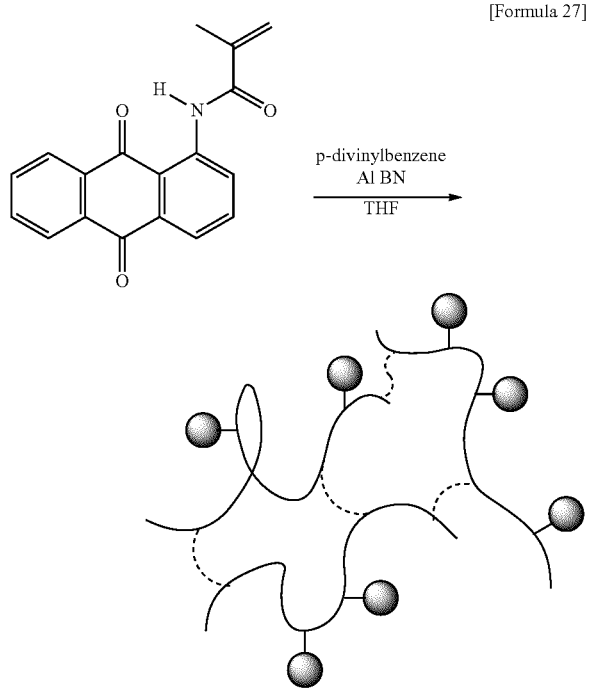

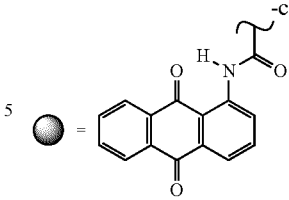

-continued

First, 1-methacrylamidoanthraquinone 50 mg (0.172 mmol, 1 eq), divinylbenzene 25 μl (microliters) (0.172 mmol, 1 eq) and AIBN (azobisisobutyronitrile) 0.48 g (3.43 μmol (micromolars), 0.02 eq) were added into THF 1.72 ml within a 10 ml recovery flask, under argon atmosphere. The resultant solution was purged with argon to remove oxygen gas dissolved in solvent. After that, the resultant solution was preserved at 70° C. for 48 hours for proceeding reaction. Subsequently, methanol was added into the resultant solution to yield a presipitation product. The presipitation product was soxhlet washed with THF to yield a polymer product 37.3 mg as a yellow solid. The polymer has an average molecular weight of 4000.

The resultant quinine polymer was employed instead of the galvi compound in Example 1 to obtain a dye-sensitized photoelectric conversion device.

The resultant dye-sensitized photoelectric conversion device gives an open-circuit voltage (OCP) of 600 mV when subjected to the same light as in Example 1. This device gives a voltage converged to 0 mV when shielded from the light. This device gives the voltage increased to 600 mV when subjected to the light again. The photoresponse was proved to be stably repeated.

According to the chronoamperometry (CA measurement) in response to a 50 mV electric voltage applied to the device, the device exhibits a photo-induced electric voltage of ca. 0.4 μA (microampere) per square centimeter when subjected to the same light as in Example 1. The device exhibits a photo-induced electric voltage converged to 0 A per square centimeter when shielded from the light. The device exhibits a photo-induced electric voltage increased to 0.4 μA (microampere) per square centimeter when subjected to the light again. The photoresponse was proved to be stably repeated (40 cycles).

Example 3

First, 4,4'-oxydiphthalic anhydride 310.20 mg (0.001 mol), N-N-dimethylacetoaminde 2 ml and 1,4-phenylenediamine 108.15 mg (0.001 mmol were added into a 30 ml recovery flask under argon atomosphere. The resultant solution was preserved at ambient temperature for 18 hours for completing reaction under argon atomosphere. Subsequently, acetone was added into the resultant solution to yield a presipitation product. The presipitation product was purified to yield a polymer product (411.8 mg) expressed by the formula 28 as a white solid.

[Formula 28]

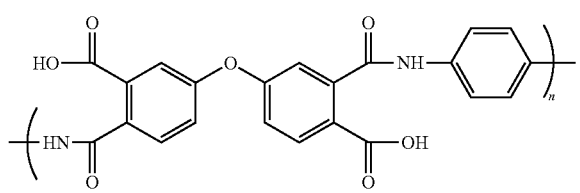

Next, this polymer product 5.47 mg was mixed with N-methylpyrrolidone 0.1 g to obtain a solution. The resultant solution was applied onto the surface of the electrode 1 by spin-coating to form a film having a 100 nm thickness. The resultant product was heated stepwise up to at 150° C., 180° C., 200° C., 220° C. each for 30 minutes, and then heated at 250° C. for 30 minutes for proceeding imidization to yield a polyimide layer for photoelectric device.

[Formula 29]

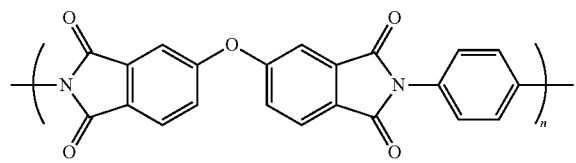

The resultant imide polymer was employed instead of galvinoxyl polymer in Example 1 to obtain a dye-sensitized photoelectric conversion device.

The resultant dye-sensitized photoelectric conversion device exhibits an open-circuit voltage (OCP) of 630 mV when subjected to light. This device exhibits an open-circuit voltage converged to 0 mV when shielded from the light. This device exhibits the open open-circuit voltage converged to 630 mV when subjected to the light again. The photoresponse was proved to be stably repeated.

According to the chronoamperometry (CA measurement) in response to a 50 mV electric voltage applied to the device, the device exhibits a photo-induced electric voltage of ca. 0.8 μA (microamperes) per square centimeter when subjected to the light. The device exhibits a photo-induced electric voltage converged to 0 A per square centimeter when shielded from the light. The device exhibits a photo-induced electric voltage increased to ca. 0.8 μA (microamperes) per square centimeter when subjected to the light again. The photoresponse was proved to be stably repeated (40 cycles).

Example 4

First, 4,4'-bipyridine (1.008 g; $6.46 \times 10^{-3}$ mol) and 1,10-dibromodecane (1.938 g, $6.46 \times 10^{-3}$ mol) was added into a $CH_3OH$-DMF (=50:50 vol %, 10 ml) mixture, and then completely dissolved therein by stirring. After stirring at 60° C. for 54 hours, a faint yellow powder is precipitated in the solution. Then, the solvent was completely evaporated to give a faint yellow precipitation product containing the solvent, by stirring for 12 hours after the precipitation. The resultant precipitation product was washed with acetonitrile and chloroform, then filtered with a glass filter, and subsequently subjected to heat-drying for solvent evaporation under reduced pressure, yielding polydecylviologen (PV10) (1.95 g, yield:65%) as a faint yellow powder. The yielded product was determined as PV10 having a polymerization degree of 10 and a molecular weight of 3200, by NMR analysis.

Next, a 0.1M aqueous solution of PV10 (10 ml, 1 mmol) was slowly dropped into 0.2 M aqueous solution of polystylene sulfonic acid (PSS) (10 ml, 2 mmol) by use of Pasteur pipet while stirring, so as to obtain faint yellow precipitation product. These concentrations are calculated based on a molecular weight per one unit of the polymer. The faint yellow precipitation product was vacuum-dried at 50° C. overnight, so as to yield PV10-PSS complex as a yellow solid.

The glass substrate 1a having a 1 nm thickness was formed at its surface with a transparent electrically conductive oxide layer 2 made of fluorine-doped $SnO_2$, in formation of the electrode 1 (available from Asahi glass Co., ltd., 10 ohms per square.

Next, a 5% by weight of aqueous solution of the above PV10-PSS complex was applied to the electrode by spin-coating at 1000 rpm, so as to form a base film having a 100 nm thickness. The above 5% by weight of aqueous solution of PV10-PSS complex was applied to this base film by spin-coating at 6000 rpm, so as to form a upper film having a 40 nm thickness, for completing an electron transfer layer 3 made of the viologen derivative. The resultant product was immersed with 5,10,15,20-tetra(phenylsulfonic acid)porphyrin zinc complex dye expressed by a formula 30 below, for five minutes, for applying the porphyrin zinc complex dye onto the electron transport layer 3. After that, the resultant product was washed with water for five minutes, for removing redundant dye.

[Formula 30]

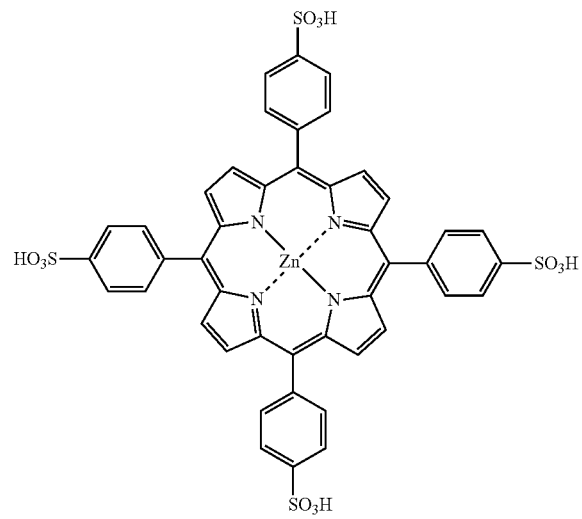

After scraping material of the electron transport layer 3 attached to a periphery of the electrode 1, thermo-melting adhesive (available as "Bynel" from Du pont-Mitsui polychemicals Co., Ltd.) was disposed as an encapsulating resin around the electron transport layer 3. Next, a counter Pt-electrode 6 was disposed oppositely to the electrode 1 which was drilled at its center by a diamond drill to have an opening. Subsequently, 0.1 mol/l of 2,2,6,6-tetramethylpiperidine-1-oxyl (TEMPO), 1.6 mol/l of N-methylbenzimidazole and 0.5 mol/l of LiTFSI (lithium bistrifluoromethanesulfonylimide) were dissolved into acetonitrile to obtain an electrolyte solution. The resultant electrolyte solution was poured through the opening. Then, the opening was encapsulated with UV-curing resin, so as to obtain a dye-sensitized solar cell (see FIG. 2).

The resultant dye-sensitized photoelectric conversion device exhibits an open-circuit voltage (OCP) of 585 mV when subjected to the same light as in Example 1. This device exhibits an open-circuit voltage converged to 0 mV when shielded from the light. This device exhibits the open open-circuit voltage converged to 585 mV when subjected to the light again. The photoresponse is proved to be stably repeated.

According to the chronoamperometry (CA measurement) in response to a 50 mV electric voltage applied to the device, the device exhibits a photo-induced electric voltage of ca. 5 μA (microamperes) per square centimeter when subjected to the same light as in Example 1. The device exhibits a photo-induced electric voltage converged to 0 A per square centimeter when shielded from the light. The device exhibits a photo-induced electric voltage increased to ca. 5 μA (microamperes) per square centimeter when subjected to the light again. The photoresponse was proved to be stably repeated (40 cycles).

Example 5

The electron transport layer 3 made of a viologen derivative was prepared in the same way as in Example 4. Besides, the electron transport layer 3 was provided with a zinc complex dye in the same way as in Example 4. After scraping material of the electron transport layer 3 attached to a periphery of the electrode 1, thermo-melting adhesive (available as "Bynel" from Du pont-Mitsui polychemicals Co., Ltd.) was disposed as an encapsulating resin to surround the electron transport layer 3. Next, a counter Pt-electrode 6 was disposed oppositely to the electrode 1 which was drilled at its center by a diamond drill to have an opening. Subsequently, 0.1 mol/l of 2,2,6,6-tetramethylpiperidine-1-oxyl (TEMPO), 1.6 mol/l of potassium chloride were dissolved into water to obtain an electrolyte solution. The resultant electrolyte solution was poured through the opening, and then the opening was encapsulated with a UV-curing resin, so as to obtain a dye-sensitized solar cell (illustrated in FIG. 2).

The resultant dye-sensitized photoelectric conversion device exhibits an open-circuit voltage (OCP) of 570 mV when subjected to the same light as in Example 1. This device exhibits an open-circuit voltage converged to 0 mV when shielded from the light. This device exhibits the open-circuit voltage converged to 570 mV when subjected to the light again. The photoresponse was proved to be stably repeated.

According to the chronoamperometry (CA measurement) in response to a 50 mV electric voltage applied to the device, the device exhibits a photo-induced electric voltage of ca. 2 μA (microamperes) per square centimeter when subjected to the light. The device exhibits a photo-induced electric voltage converged to 0 A per square centimeter when shielded from the light. The device exhibits a photo-induced electric voltage increased to ca. 2 μA (microamperes) per square centimeter when subjected to the light again. The photoresponse of the device was proved to be stably repeated (40 cycles).

Comparative Example 1

The glass substrate 1a having a 1 nm thickness was formed at its surface with a transparent electrically conductive oxide layer 2 made of fluorine-doped $SnO_2$, in formation of the electrode 1 (available from Asahi glass Co., Ltd., 10 ohms per square).

Fullerene (C60) was vapor-deposited onto the electrode 1, so as to form an electron transport layer 3 having a 10 nm thickness. The resultant lamimnate containing the electrode 1 and the electron transport layer 3 was subjected to cyclic voltammetry measurement, giving no distinct signal as redox wave.

Next, the electron transport layer 3 was provided with a dye in the same way as in Example 1, so as to obtain a dye-sensitized solar cell in the same way as in Example 1.

The resultant dye-sensitized photoelectric conversion device exhibits an open-circuit voltage (OCP) of 70 mV when subjected to the same light as in Example 1. According to the chronoamperometry (CA measurement), the device exhibits a photo-induced electric voltage of 10 mA or less per square centimeter. This device gives no photoresponse stably repeated.

The above results for devices according to Examples 1-5 and Comparative example 1 demonstrate that the photoelectric device of the present invention gives the superior electron-transporting performance in the electron transport layer, and brings advantageous effects resulting from a sufficiently large dimentional interface.

REFERENCE SIGNS LIST

1 Electrode
2 Transparent electrically conductive oxide layer
3 Electron transport layer
4 Hole transport layer
5 Electrode
6 Counter electrode
7 Gel layer

The invention claimed is:
1. A photoelectric device comprising:
a pair of electrodes;
an electron transport layer disposed between said electrodes;
a hole transport layer disposed between said electrodes;
wherein said electron transport layer is made of an organic compound having a tridimensional network structure and comprising a redox moiety capable of being oxidized and reduced repeatedly,
wherein said organic compound is swollen with an electrolyte solution that is filled within the tridimensional network of the organic compound to form a gel layer, and which stabilizes a reduction state of said redox moiety, and
wherein said photoelectric device comprises a dye at an interface between said electron transport layer and said hole transport layer.

2. The photoelectric device as set forth in claim 1, wherein said redox moiety of said organic compound is made of a phenoxyl derivative.

3. The photoelectric device as set forth in claim 2, wherein said organic compound has an average molecular weight of 1000 or more.

4. The photoelectric device as set form in claim 2, wherein said hole transport layer contains a stable radical compound which generates a radical compound during at least one of an electrochemical oxidation reaction and reduction reaction.

5. The photoelectric device as set forth in claim 1, wherein said redox moiety of said organic compound is made of a quinone derivative.

6. The photoelectric device as set forth in claim 5, wherein said organic compound has an average molecular weight of 1000 or more.

7. The photoelectric device as set form in claim 5, wherein said hole transport layer contains a stable radical compound which generates a radical compound during at least one of an electrochemical oxidation reaction and reduction reaction.

8. The photoelectric device as set forth in claim 1, wherein said redox moiety of said organic compound is made of an imide derivative.

9. The photoelectric device as set forth in claim 8, wherein said organic compound has an average molecular weight of 1000 or more.

10. The photoelectric device as set form in claim 8, wherein said hole transport layer contains a stable radical compound which generates a radical compound during at least one of an electrochemical oxidation reaction and reduction reaction.

11. The photoelectric device as set forth in claim 1, wherein said redox moiety of said organic compound is made of a viologen derivative.

12. The photoelectric device as set forth in claim 1, wherein said organic compound has an average molecular weight of 1000 or more.

13. The photoelectric device as set forth in claim 1, wherein said electron transport layer has a thickness of 100 nm or more.

14. The photoelectric device as set form in claim 1, wherein said hole transport layer contains a stable radical compound which generates a radical compound during at least one of an electrochemical oxidation reaction and reduction reaction.

15. The photoelectric device as set forth in claim 14, wherein said radical compound is an organic compound containing at least one of structural units expressed by Formulas 13 and 14:

[Formula 13]

where substituent $R^1$ is selected from substituted or unsubstituted $C_2$-$C_{30}$ alkylene groups, $C_2$-$C_{30}$ alkenylene groups and $C_4$-$C_{30}$ arylene groups; X is selected from oxyradical groups, nitroxyl radical groups, sulfur radical groups, hydrazyl radical groups, carbon radical groups, and boron radical groups; and $n^1$ is an integer more than one; and

[Formula 14]

$$-\!\!\!-\!\!\left[\!R^2\!-\!\overset{\cdot}{Y}\!-\!R^3\right]_{\!n^2}\!\!\!-$$

where: substituents $R^2$ and $R^3$ are independently selected from substituted/unsubstituted alkylene groups each having 2-30 carbon atoms, alkenylene groups each having 2-30 carbon atoms, or arylene groups each having 4-30 carbon atoms; Y is a nitroxyl radical group, a sulfur radical group, a hydrazyl radical group or a carbon radical group; and $n^2$ is an integer more than one.

* * * * *